United States Patent
Kadoshima et al.

(10) Patent No.: US 7,618,855 B2
(45) Date of Patent: Nov. 17, 2009

(54) MANUFACTURING METHOD OF SEMICONDUCTOR DEVICE

(75) Inventors: Masaru Kadoshima, Tokyo (JP); Toshihide Nabatame, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 246 days.

(21) Appl. No.: 11/540,506

(22) Filed: Oct. 2, 2006

(65) Prior Publication Data

US 2007/0087537 A1    Apr. 19, 2007

(30) Foreign Application Priority Data

Oct. 13, 2005   (JP)   ............................. 2005-298795

(51) Int. Cl.
*H01L 21/8238*    (2006.01)

(52) U.S. Cl. .................. 438/199; 438/644; 438/648; 438/649; 438/682; 257/E21.438

(58) Field of Classification Search ......... 438/199–217, 438/648–657, 682–686; 257/E21.438, E21.439
See application file for complete search history.

(56) References Cited

U.S. PATENT DOCUMENTS

| | | | |
|---|---|---|---|
| 6,274,470 | B1 | 8/2001 | Ichimori et al. |
| 6,927,117 | B2 | 8/2005 | Cabral, Jr. et al. |
| 7,064,038 | B2 | 6/2006 | Kudo et al. |
| 7,153,770 | B2 | 12/2006 | Choi |
| 2005/0056881 | A1* | 3/2005 | Yeo et al. ................. 257/315 |
| 2005/0118757 | A1* | 6/2005 | Cabral et al. ............. 438/199 |
| 2005/0167832 | A1* | 8/2005 | Kainou et al. ............ 257/738 |
| 2005/0266684 | A1* | 12/2005 | Lee et al. ................. 438/653 |
| 2006/0035427 | A1* | 2/2006 | Kudo et al. .............. 438/213 |
| 2006/0121663 | A1* | 6/2006 | Fang et al. ............... 438/199 |
| 2007/0138580 | A1* | 6/2007 | Takahashi et al. ........ 257/412 |

FOREIGN PATENT DOCUMENTS

| | | |
|---|---|---|
| JP | 11-126761 | 10/1997 |
| JP | 2001-156022 | 11/1999 |

(Continued)

OTHER PUBLICATIONS

Japanese Office Action dated Aug. 12, 2008 regarding Japanese Patent Application No. 2005-298795 in Japanese.

*Primary Examiner*—H. Jey Tsai
(74) *Attorney, Agent, or Firm*—Stites & Harbison PLLC; Juan Carlos A. Marquez, Esq.

(57) ABSTRACT

A technology capable of improving the yield in a manufacturing process of a MISFET with a gate electrode formed of a metal silicide film. A gate insulating film is formed on a semiconductor substrate and silicon gate electrodes formed of a polysilicon film are formed on the gate insulating film. Then, after a silicon oxide film is formed so as to cover the silicon gate electrodes, a surface of the silicon oxide film is polished by CMP, thereby exposing the surface of the silicon gate electrodes. Subsequently, a patterned insulating film is formed on the silicon oxide film. Thereafter, an adhesion film is formed on the silicon oxide film and the insulating film. Then, a nickel film is formed on the adhesion film. Thereafter, a silicide reaction is caused to occur between the silicon gate electrode and the nickel film via the adhesion film.

10 Claims, 13 Drawing Sheets

FOREIGN PATENT DOCUMENTS

| | | |
|---|---|---|
| JP | 2002-314074 | 9/2001 |
| JP | 2003-332579 | 5/2002 |
| JP | 2004-221226 | 1/2003 |
| JP | 2005-57233 | 11/2003 |
| JP | 2005-167251 | 12/2004 |

* cited by examiner

MANUFACTURING METHOD OF SEMICONDUCTOR DEVICE

CROSS-REFERENCE TO RELATED APPLICATION

The present application claims priority from Japanese Patent Application No. JP 2005-298795 filed on Oct. 13, 2005, the content of which is hereby incorporated by reference into this application.

TECHNICAL FIELD OF THE INVENTION

The present invention relates to manufacturing technologies of semiconductor device. More particularly, it relates to a technology effectively applied to the manufacture of a MISFET (Metal Insulator Semiconductor Field Effect Transistor) using a metal silicide film as a gate electrode.

BACKGROUND OF THE INVENTION

In an n channel MISFET and a p channel MISFET forming a CMIS (Complementary Metal Insulator Semiconductor) circuit, a silicon oxide film is used as a gate insulating film. Also, a polysilicon film or a multilayered film (polycide film) formed by stacking a metal silicide film such as a tungsten silicide film or a cobalt silicide film on a polysilicon film is used as a gate electrode formed on the gate insulating film.

However, in accordance with the trend of the scaling down of the MISFET size in recent years, the thickness of the gate insulating film has been rapidly reduced. As the film thickness of the gate insulating film is reduced, a phenomenon occurs, in which electrons pass through the gate insulating film due to the tunnel effect, which causes a problem of an increase in leakage current of the MISFET.

For its solution, the use of a high dielectric film with a dielectric constant higher than that of a silicon oxide film as a gate insulating film has been examined. When such a high dielectric film is used as a gate insulating film, an actual physical film thickness can be increased by a factor of "dielectric constant of the high dielectric film/dielectric constant of the silicon oxide film", even if the capacitance in terms of the silicon oxide film thickness is the same. Accordingly, it is possible to reduce the leakage current (for example, see Japanese Patent Application Laid-Open Publication No. 2002-314074).

SUMMARY OF THE INVENTION

However, when the gate insulating film is formed of such a high dielectric film and the gate electrode is formed of a polysilicon film or a polycide film, a problem of increasing the threshold voltage occurs. Such an increase in threshold voltage is not observed when the gate insulating film is formed of a silicon oxide film and is a phenomenon which occurs because the gate insulating film is formed of a high dielectric film. That is, the work function of the gate electrode formed on the gate insulating film formed of a silicon oxide film or a silicon oxynitride film is equivalent to a work function of the material of the gate electrode itself. Meanwhile, it has been known that, when a high dielectric film typified by a hafnium oxide is used, the work function of the gate electrode formed on the high dielectric film fluctuates from the work function of the material of the gate electrode itself. This is interpreted as Fermi level pinning. As described above, when a high dielectric film is used as a gate insulating film, the work function of the gate electrode fluctuates, and the threshold voltage of the MISFET is increased. Fermi level pinning can occur in any of an n channel MISFET and a p channel MISFET but, in particular, occur significantly in a p channel MISFET.

In such a circumstance, a technology in which a metal silicide film is used as a gate electrode instead of a polysilicon film has been studied. For example, a full silicide electrode formed of a nickel silicide film is used as a gate electrode of an n channel MISFET. The full silicide electrode indicates a gate electrode formed of a metal silicide film with a composition ratio of silicon atoms to metal atoms of approximately 1. The composition thereof in the case of a nickel silicide film is NiSi. Meanwhile, a partial silicide electrode formed of a nickel silicide film is used as a gate electrode of a p channel MISFET. The partial silicide electrode indicates a gate electrode formed of a metal silicide film with a composition ratio of silicon atoms to metal atoms of smaller than 1. The composition thereof in the case of a nickel silicide film is (NiSix: x<1), which can be, for example, $Ni_3Si$. As described above, by forming the gate electrode of the n channel MISFET from a full silicide electrode and the gate electrode of the p channel MISFET from a partial silicide electrode, the threshold voltage of each MISFET can be reduced even when a high dielectric film is used as a gate insulating film.

The full silicide electrode and the partial silicide electrode formed of, for example, a nickel silicide film can be formed through a silicide reaction at relatively low temperature performed after forming a gate electrode from a polysilicon film. Therefore, these electrodes are consistent with a process of forming a polysilicon film as a gate electrode.

More specifically, an example of a process for forming a partial silicide electrode for a p channel MISFET will be described. First, a gate insulating film formed of a high dielectric film is formed on a semiconductor substrate, and then a polysilicon film is formed on this gate insulating film. Subsequently, a silicon gate electrode formed of a polysilicon film is formed through photolithography and etching process. Then, after a source region and a drain region are formed in alignment with the silicon gate electrode, an insulating film is formed on the semiconductor substrate so as to cover the silicon gate electrode. Next, the surface of the insulating film is planarized to expose the surface of the silicon gate electrode. Subsequently, a metal film such as a nickel film or a platinum film is formed on the insulating film including the surface of the exposed silicon gate electrode. Then, a thermal treatment is performed to the semiconductor substrate to react the silicon gate electrode and the metal film together. By doing so, a partial silicide electrode with a composition ratio of silicon atoms to metal atoms of smaller than 1 is formed. The partial silicide electrode can be formed by sufficiently increasing the film thickness of the metal film compared with the thickness of the silicon gate electrode.

Note that the metal film is formed not only on the silicon gate electrode formed of a polysilicon film but also on the insulating film where the surface of the silicon gate electrode is exposed. In particular, since a region where the surface of the silicon gate electrode is exposed is very small, the metal film is formed mainly on a region formed of the insulating film. The insulating film is formed of, for example, a silicon oxide film, whilst the metal film is formed of, for example, a nickel film or a platinum film. Such a nickel film or platinum film formed on the silicon oxide film has a poor adhesion property. For this reason, for example, in a silicide reaction process at temperature about 400° C. or in a CMP (chemical Mechanical Polishing) process for removing an unreacted portion of the nickel film or platinum film after the silicide reaction process, the film comes off in some cases. When a film comes off, foreign matters are produced, which leads to a problem of decreasing the yield in a manufacturing process of a semiconductor device. Further, it also leads to a problem of increasing the management cost of manufacturing apparatus.

An object of the present invention is to provide a technology capable of increasing the yield in a manufacturing process of a MISFET with a gate electrode formed of a metal silicide film.

Another object of the present invention is to provide a technology capable of achieving a reduction in management cost of a manufacturing apparatus in the manufacturing process of a MISFET with a gate electrode formed of a metal silicide film.

The above and other objects and novel characteristics of the present invention will be apparent from the description of this specification and the accompanying drawings.

The typical ones of the inventions disclosed in this application will be briefly described as follows.

The manufacturing method of a semiconductor device according to the present invention comprises the steps of: (a) forming a gate insulating film with a dielectric constant higher than that of a silicon oxide film on a semiconductor substrate; (b) forming a silicon gate electrode on the gate insulating film; and (c) forming an insulating film having a film thickness larger than that of the silicon gate electrode on the semiconductor substrate. Also, it comprises the steps of: (d) exposing a surface of the silicon gate electrode by planarizing a surface of the insulating film; (e) forming an adhesion film on the insulating film including the exposed silicon gate electrode; and (f) forming a metal film on the adhesion film. Further, it comprises the steps of: (g) forming a gate electrode composed of a metal silicide film by heating the semiconductor substrate to cause a reaction between the silicon gate electrode and the metal film; and (h) sequentially removing an unreacted portion of the metal film and the adhesion film.

The effects obtained by typical aspects of the present invention will be briefly described below.

An adhesion film is formed on an insulating film where the surface of a silicon gate electrode is exposed. Then, after forming a metal film on the adhesion film, the semiconductor substrate is heated. By doing so, the silicon gate electrode is reacted with the metal film to form a gate electrode formed of a metal silicide film. Since the adhesion film is formed on the insulating film as described above, the metal film and the insulating film sufficiently adhere to each other via the adhesion film. Therefore, it is possible to suppress a situation where the metal film comes off in a silicide reaction process or the like, thereby achieving an increase in manufacturing yield and a reduction in management cost of manufacturing apparatus.

BRIEF DESCRIPTIONS OF THE DRAWINGS

FIG. 22 is a section view for describing a manufacturing process of a semiconductor device in a third embodiment of the present invention; and.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
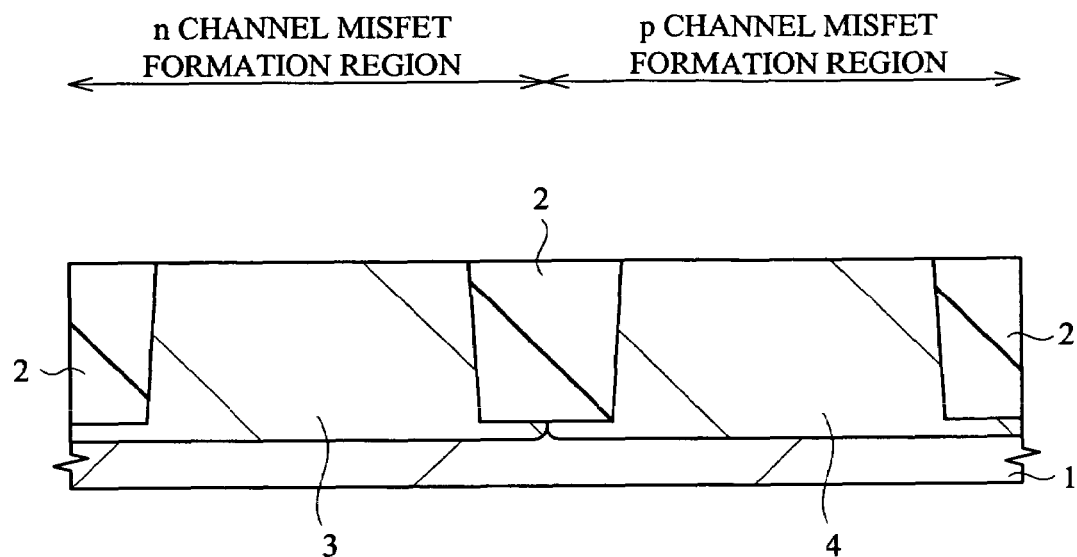
FIG. 1 is a section view for describing a manufacturing process of a semiconductor device in a first embodiment of the present invention.

A manufacturing method of a semiconductor device according to a first embodiment will be described with reference to the drawings. First, as shown in FIG. 1, the well-known STI (Shallow Trench Isolation) technology is used to form isolation regions 2 in a main surface of a semiconductor substrate 1 formed of p type single crystal silicon. The isolation regions 2 are formed by forming trenches in the semiconductor substrate 1, filling the trench with a silicon oxide film, and then polishing the surface of the semiconductor substrate 1 using CMP (Chemical Mechanical Polishing).

Next, boron is ion-implanted into an n channel MISFET formation region of the semiconductor substrate 1, and phosphorus is ion-implanted into a p channel MISFET formation region of the semiconductor substrate 1. Subsequently, a thermal treatment is performed to the semiconductor substrate 1. By doing so, boron and phosphorus are diffused in the semiconductor substrate 1 to form a p well 3 and an n well 4.

Figure 2:
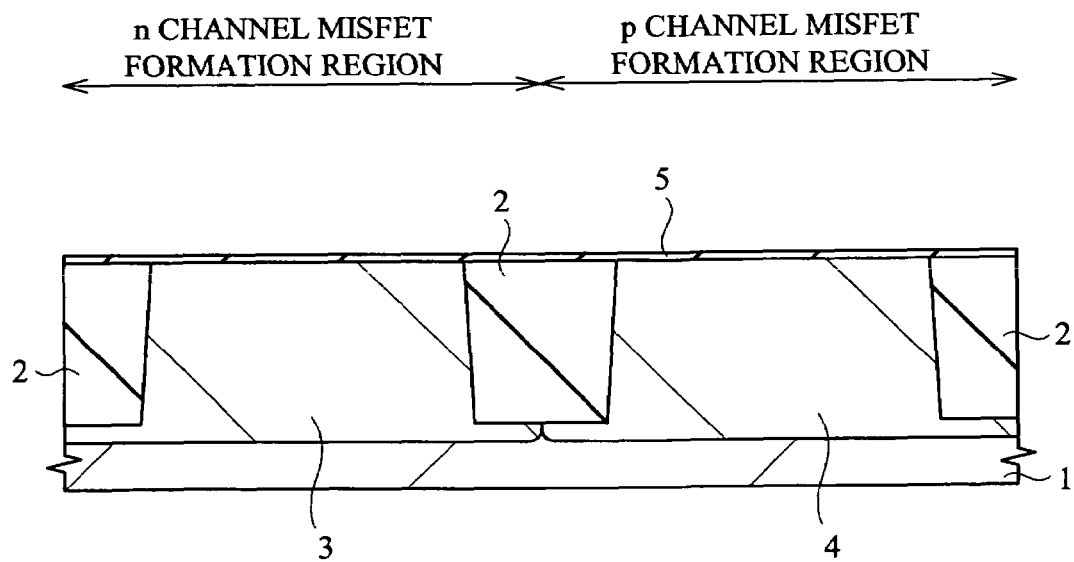
FIG. 2 is a section view for describing the manufacturing process of a semiconductor device continued from FIG. 1.

Then, impurities for adjusting a threshold voltage of the MISFET are ion-implanted into the surface of each of the p well 3 and the n well 4. Thereafter, as shown in FIG. 2, a gate insulating film 5 formed of a hafnium aluminate film is formed on the surface of each of the p well 3 and the n well 4. The hafnium aluminate film can be formed by using CVD (Chemical Vapor Deposition) or ALD (Atomic Layer Deposition).

Conventionally, from the aspect of high insulation resistance and excellent electric and physical stability at an interface between silicon and silicon oxide, a silicon oxide film is used as a gate insulating film.

However, in accordance with the scaling down of element size, the gate insulating film with an extremely small thickness has been increasingly demanded. If such an extremely-thin silicon oxide film is used as a gate electrode, electrons flowing in a channel of the MISFET tunnel through a barrier wall formed of a silicon oxide film to flow into the gate electrode, that is, a so-called tunnel current occurs.

For its prevention, by using a material with a dielectric constant higher than that of the silicon oxide film, a high dielectric film capable of increasing a physical film thickness even with the same capacitance has been used. With such a high dielectric film, the physical thickness can be increased even with the same capacitance. Therefore, it is possible to reduce the leakage current.

For example, a hafnium aluminate film (HfAlON film) which is a hafnium oxide is used as a high dielectric film. In place of a hafnium aluminate film, another hafnium-based insulating film such as a hafnium oxide film, an HfON film, an HfSiO film, an HfSiON film, or an HfAlO film can be used. Furthermore, it is also possible to use a hafnium-based insulating film obtained by introducing an oxide such as tantalum oxide, niobium oxide, titanium oxide, zirconium oxide, lanthanum oxide, or yttrium oxide to the above-mentioned hafnium-based insulating film. Similar to the hafnium aluminate film, the hafnium-based insulating film has a dielectric constant higher than those of a silicon oxide film and a silicon oxynitride film. Therefore, it is possible to achieve effects similar to those when the hafnium aluminate film is used.

Furthermore, the high dielectric film may be formed of a film mainly containing any one of $La_2O_3$, La—O—N, La—Si—O, La—Si—O—N, $Y_2O_3$, Y—O—N, Y—Si—O, Y—Si—O—N, $Gd_2O_3$, Gd—O—N, Gd—Si—O, and Gd—Si—O—N.

Figure 3:
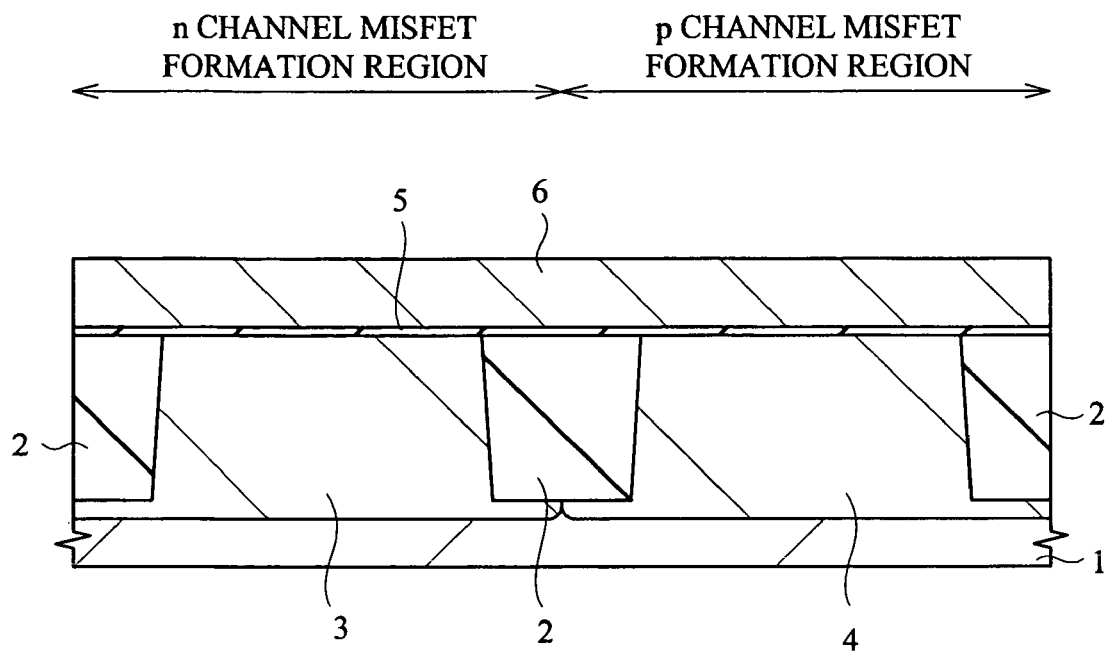
FIG. 3 is a section view for describing the manufacturing process of a semiconductor device continued from FIG. 2.
Figure 4:
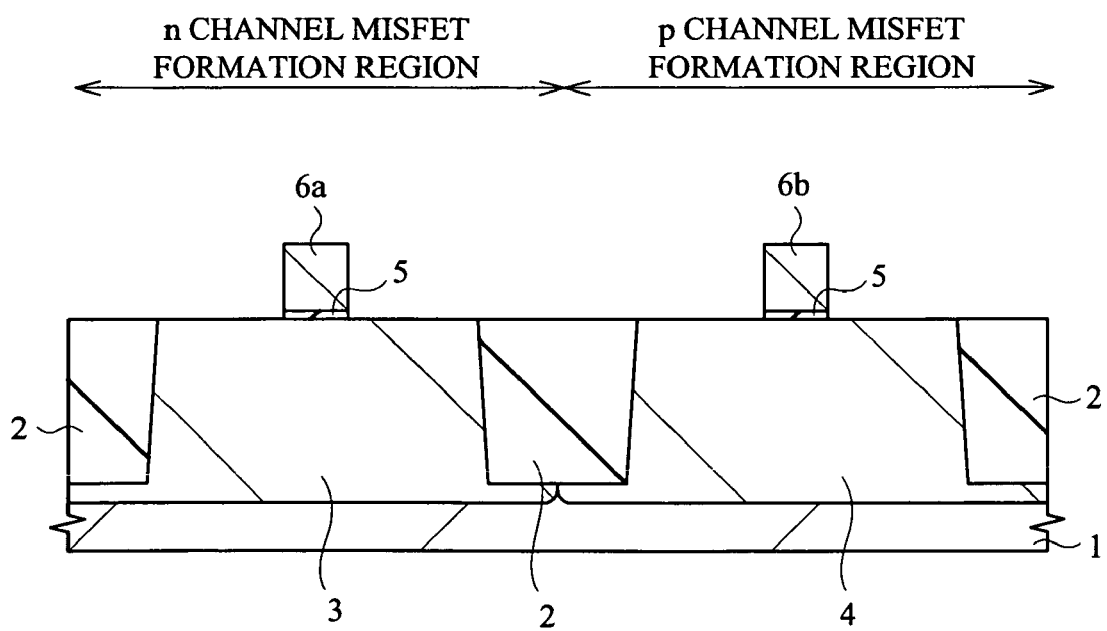
FIG. 4 is a section view for describing the manufacturing process of a semiconductor device continued from FIG. 3.

Next, as shown in FIG. 3, a polysilicon film 6 is formed on the gate insulating film 5. For example, the polysilicon film 6 can be formed by using CVD. The thickness of the polysilicon film 6 is, for example, 50 nm. Subsequently, as shown in FIG. 4, a silicon gate electrode (first silicon gate electrode) 6a and a silicon gate electrode (second silicon gate electrode) 6b are formed through photolithography and etching process. These silicon gate electrodes 6a and 6b are formed of the polysilicon film 6.

Figure 5:
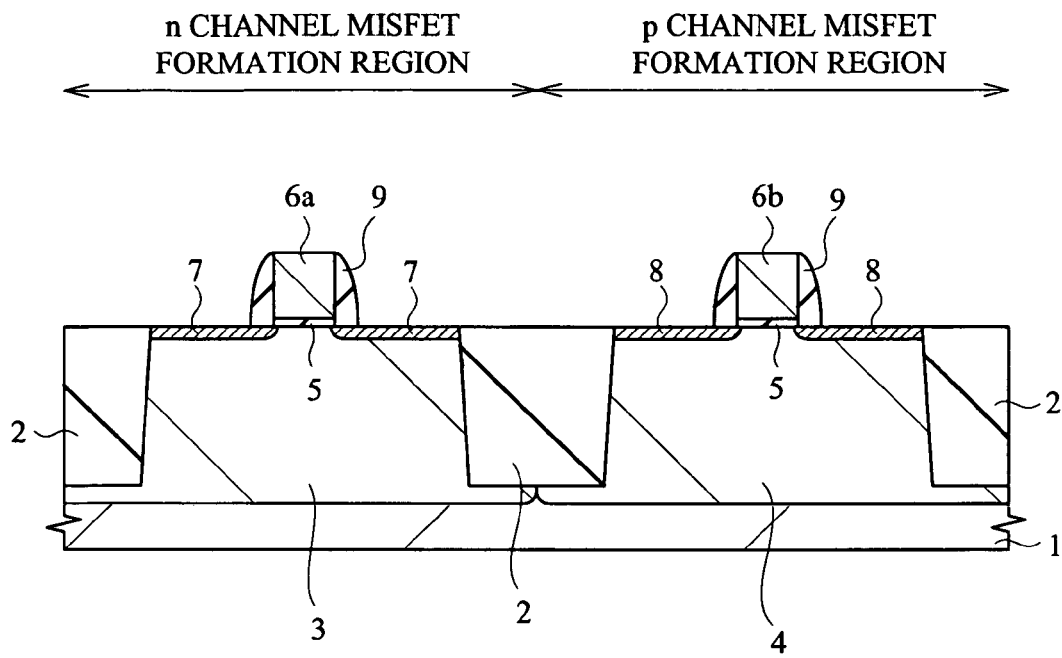
FIG. 5 is a section view for describing the manufacturing process of a semiconductor device continued from FIG. 4.

Then, as shown in FIG. 5, phosphorus or arsenic is ion-implanted into the p well 3, thereby forming low-concentration n type impurity diffusion regions 7 in alignment with the silicon gate electrode 6a. Similarly, boron is ion-implanted into the n well 4, thereby forming low-concentration p type impurity diffusion regions 8 in alignment with the silicon gate electrode 6b. Then, sidewalls 9 are formed on both sides of each of the silicon gate electrodes 6a and 6b. The sidewalls 9 are formed by forming a silicon oxide film through CVD on the semiconductor substrate 1 and then performing anisotropic etching to the formed silicon oxide film.

Figure 6:
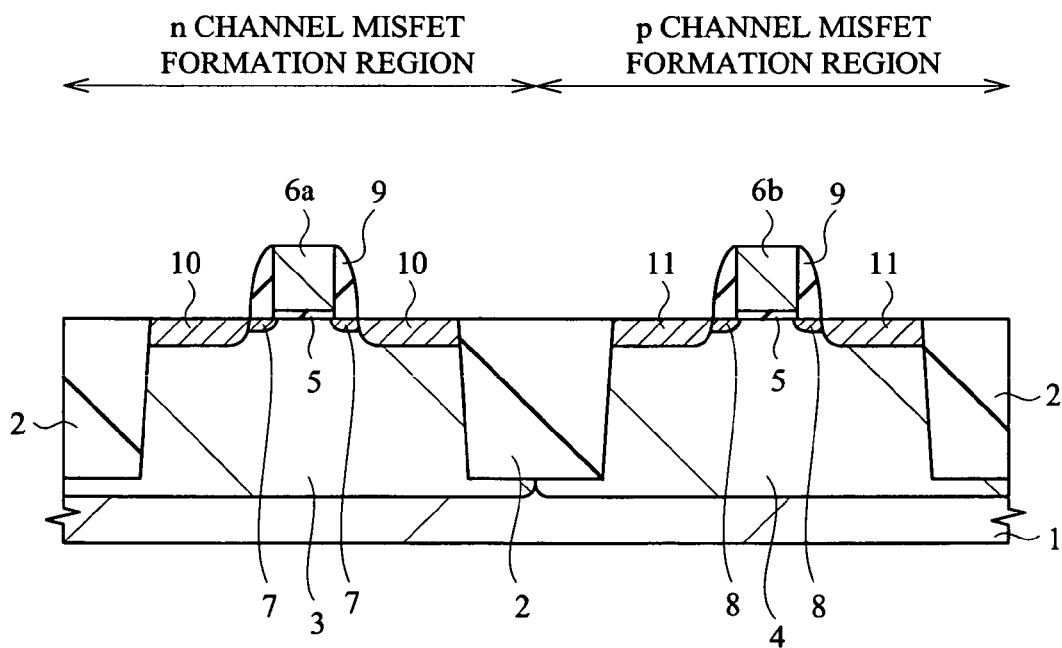
FIG. 6 is a section view for describing the manufacturing process of a semiconductor device continued from FIG. 5.

Next, as shown in FIG. 6, phosphorus or arsenic is ion-implanted into the p well 3 and boron is ion-implanted into the n well 4. Thereafter, a thermal treatment is performed to the semiconductor substrate to diffuse these impurities, thereby forming high-concentration n type impurity diffusion regions 10 in the p well 3 and high-concentration p type impurity diffusion regions 11 in the n well 4. At this time, the high-concentration n type impurity diffusion regions 10 and the high-concentration p type impurity diffusion regions 11 are formed in alignment with the sidewalls 9.

The concentration of the introduced impurity in the high-concentration n type impurity diffusion regions 10 is higher than that in the low-concentration n type impurity diffusion regions 7. A source region and a drain region of the n channel MISFET are formed from the high-concentration n type impurity diffusion regions 10 and the low-concentration n type impurity diffusion regions 7. A reason why the source region and the drain region are formed from the high-concentration n type impurity diffusion regions 10 and the low-concentration n type impurity diffusion regions 7 is that the source region and the drain region are required to have an LDD (Lightly Doped Drain) structure. By the LDD structure, concentration of electric fields under an end of the silicon gate electrode 6a can be mitigated. Similarly, a source region and a drain region of the p channel MISFET are formed from the high-concentration p type impurity diffusion regions 11 and the low-concentration p type impurity diffusion regions 8.

Figure 7:
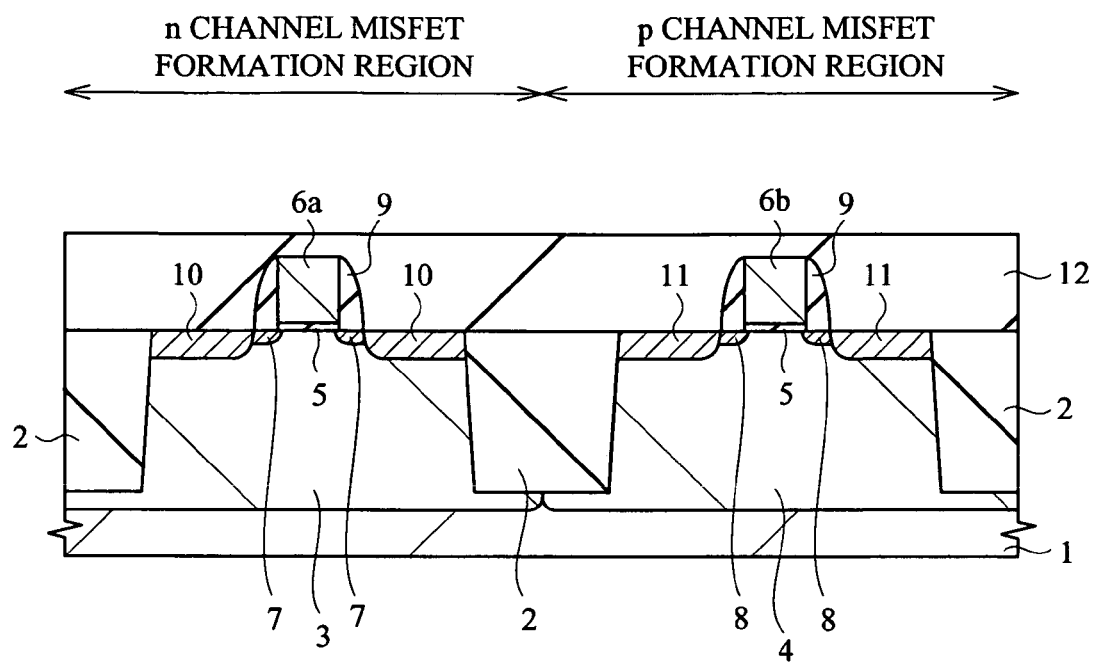
FIG. 7 is a section view for describing the manufacturing process of a semiconductor device continued from FIG. 6.
Figure 8:
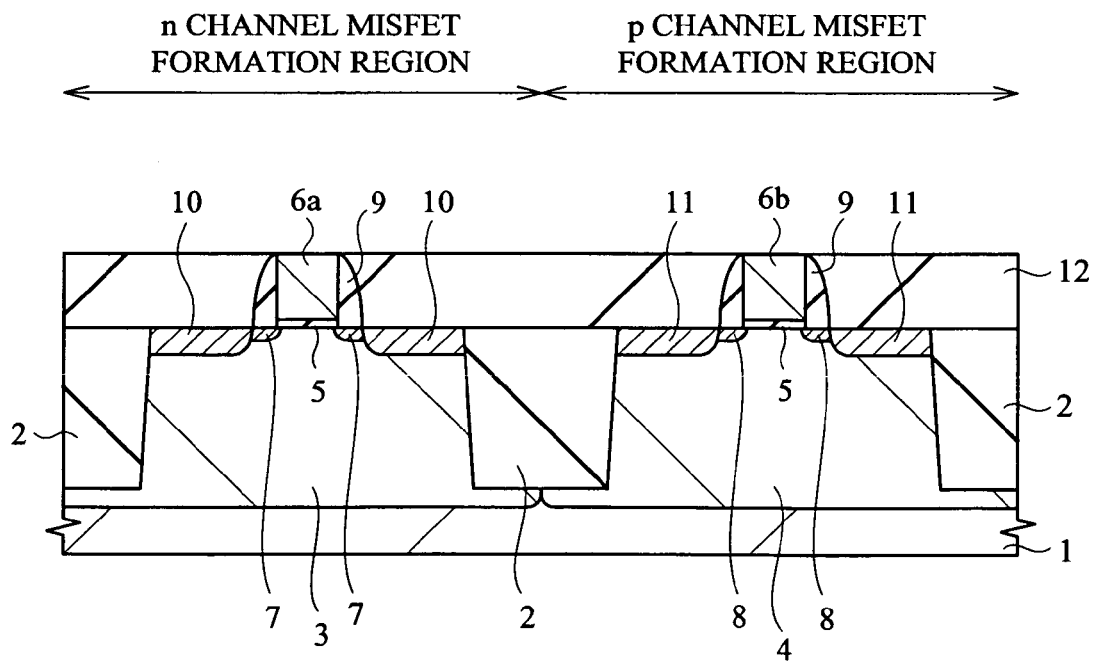
FIG. 8 is a section view for describing the manufacturing process of a semiconductor device continued from FIG. 7.

Then, as shown in FIG. 7, a silicon oxide film (insulating film, first insulating film) 12 having a film thickness larger than those of the silicon gate electrodes 6a and 6b is formed on the semiconductor substrate 1. More specifically, the silicon oxide film 12 is formed so as to cover the silicon gate electrodes 6a and 6b. For example, the silicon oxide film 12 can be formed by using CVD. Thereafter, as shown in FIG. 8, CMP is used to polish and planarize the surface of the silicon oxide film 12. By doing so, the surface of the silicon gate electrodes 6a and 6b is exposed from the surface of the silicon oxide film 12.

Figure 9:
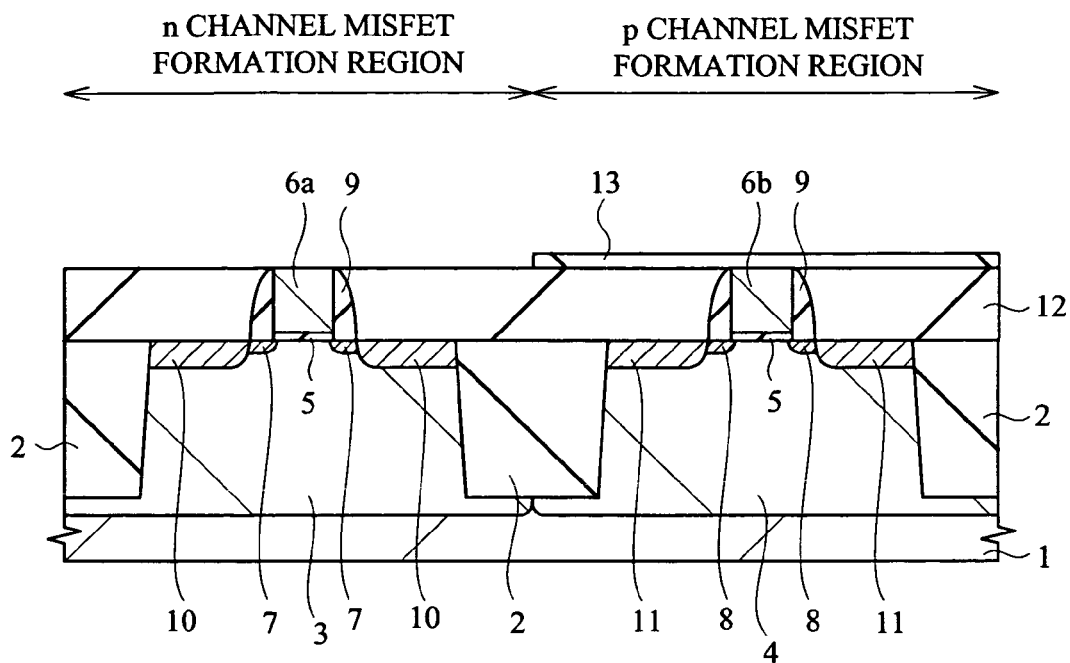
FIG. 9 is a section view for describing the manufacturing process of a semiconductor device continued from FIG. 8.

Next, after an insulating film (second insulating film) 13 is formed on the silicon oxide film 12 where the surfaces of the silicon gate electrodes 6a and 6b are exposed, an insulating film 13 is patterned through photolithography and etching process as shown in FIG. 9. This patterning is performed so that the insulating film 13 is left only in the p channel MISFET formation region. More specifically, by selectively forming the insulating film 13, the p channel MISFET formation region including the surface of the silicon gate electrode 6b is covered with the insulating film 13.

Figure 10:
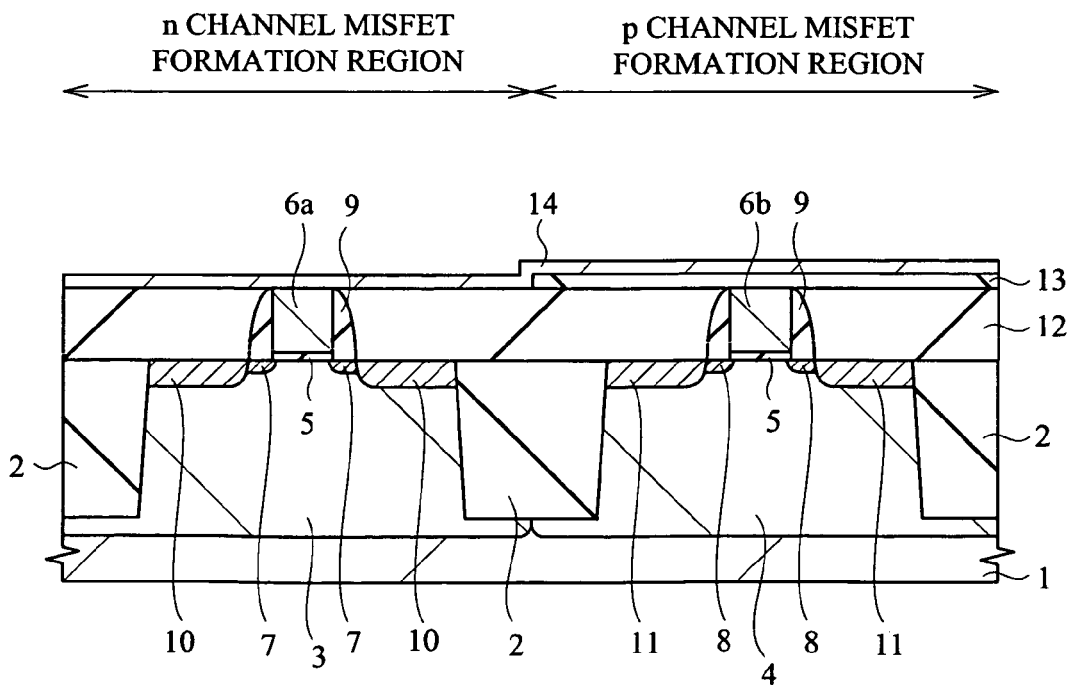
FIG. 10 is a section view for describing the manufacturing process of a semiconductor device continued from FIG. 9.
Figure 11:
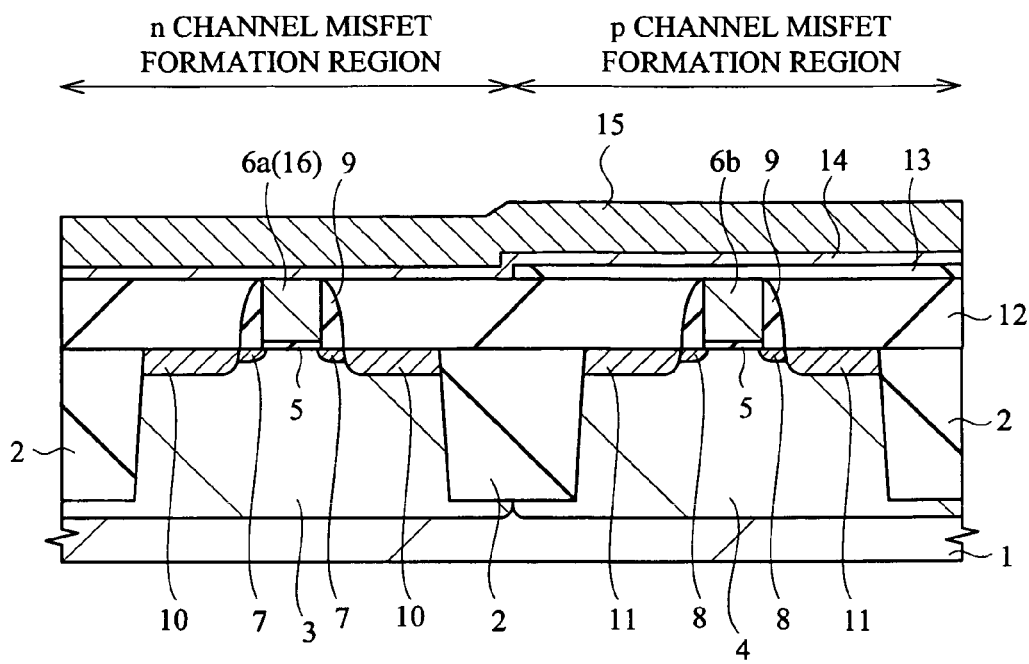
FIG. 11 is a section view for describing the manufacturing process of a semiconductor device continued from FIG. 10.

Then, as shown in FIG. 10, an adhesion film (second adhesion film) 14 is formed on the silicon oxide film 12 including the silicon gate electrode 6a formed in the n channel MISFET formation region and the insulating film 13 formed in the p channel MISFET formation region. Then, as shown in FIG. 11, a nickel film (first metal film) 15 is formed on this adhesion film 14. One of the features of the present invention is that the adhesion film 14 is formed between the silicon oxide film 12 and the nickel film 15 in this manner. Conventionally, no adhesion film 14 is present and the nickel film 15 is formed directly on the silicon oxide film 12. It has been found that the adhesion property between the polysilicon film which forms the silicon gate electrode 6a and the nickel film 15 is excellent, but the adhesion property between the silicon oxide film 12 and the nickel film 15 is not so good. For this reason, in a silicide reaction process and a CMP process for removing an unreacted portion of the nickel film 15 described further below, the nickel film 15 comes off from the silicon oxide film 12 and foreign matters are produced. The occurrence of foreign matters due to the coming-off of the film causes a decrease in yield in the manufacturing process and also an increase in management cost of the manufacturing apparatus. In particular, on the semiconductor substrate 1, a region where the silicon gate electrode 6a is exposed is very small, and most of the semiconductor substrate 1 is covered with the silicon oxide film 12 or the insulating film 13. Therefore, most of the nickel film 15 is formed on the silicon oxide film 12 or the insulating film 13 with a low adhesion property. Accordingly, the low adhesion property between the nickel film 15 and the silicon oxide film 12 is the problem to be solved.

For its solution, in the first embodiment, the adhesion film 14 is formed on the silicon oxide film 12 and the insulating film 13, and the nickel film 15 is formed on this adhesion film 14. More specifically, a direct contact between the silicon oxide film 12 and the nickel film 15 with a low adhesion property is avoided. The adhesion film 14 is formed of, for example, a titanium film, a hafnium film, a zirconium film, or a tantalum film and has a film thickness of 5 nm or smaller. For example, the adhesion film 14 can be formed by spattering. The adhesion film 14 formed of the material mentioned above has good adhesion property with the silicon oxide film 12 and the insulating film 13 and with the nickel film 15. Therefore, in the thermal treatment process at the time of silicide reaction or the CMP process for removing an unreacted portion of the nickel film 15, the coming off of the nickel film 15 can be prevented. Accordingly, it is possible to suppress the occurrence of foreign matters due to the coming-off of the nickel film 15, thereby increasing the yield in the manufacturing process. Furthermore, it is also possible to achieve the reduction in management cost of the manufacturing apparatus.

As shown in FIG. 11, the nickel film 15 is formed on the adhesion film 14, and this nickel film 15 can be formed by using spattering, for example. The nickel film 15 has a film thickness of, for example, 35 nm. At this time, the nickel film 15 is formed via the adhesion film 14 on the silicon gate electrode 6a formed in the n channel MISFET formation region. On the other hand, the insulating film 13 is formed on the silicon gate electrode 6b formed in the p channel MISFET formation region, and the adhesion film 14 and the nickel film 15 are formed on this insulating film 13.

Next, a thermal treatment at about 400° C. is performed to the semiconductor substrate 1. By this means, a silicide reaction proceeds between the silicon gate electrode 6a and the nickel film 15 having the adhesion film 14 therebetween, thereby forming a gate electrode 16 composed of a nickel silicide film. By setting the film thickness of the nickel film 15 to about 60% to 70% of the film thickness of the silicon gate electrode 6a, the nickel silicide film formed through the reaction between the silicon gate electrode 6a and the nickel film 15 has a ratio of silicon atoms to nickel atoms of approximately 1 ($NiSi_x$:x=1). That is, the gate electrode 16 is formed of a full silicide electrode with a ratio of silicon atoms to nickel atoms of approximately 1.

In this case, in the nickel silicide film, it is desirable that the composition ratio of silicon atoms to nickel atoms is set to approximately 1. Although the composition ratio of silicon atoms may be smaller than 1, as a relative nickel atom ratio increases, the work function of the gate electrode 16 is increased in the n channel MISFET. For this reason, as a nickel atom ratio increases, the threshold voltage of the n channel MISFET is increased. In order to suppress the increase in threshold voltage, it is desirable that the composition ratio of silicon atoms to nickel atoms is set to approximately 1. Such a composition ratio of silicon atoms to metal atoms similarly holds true of the case where another metal silicide film is used. More specifically, the metal film may be formed of, for example, a platinum film, a ruthenium film, an iridium film, or the like in place of the nickel film 15. Also in this case, since the adhesion property with the adhesion film 14 is excellent, it is possible to suppress the occurrence of foreign matters due to the coming-off of a film.

Figure 12:
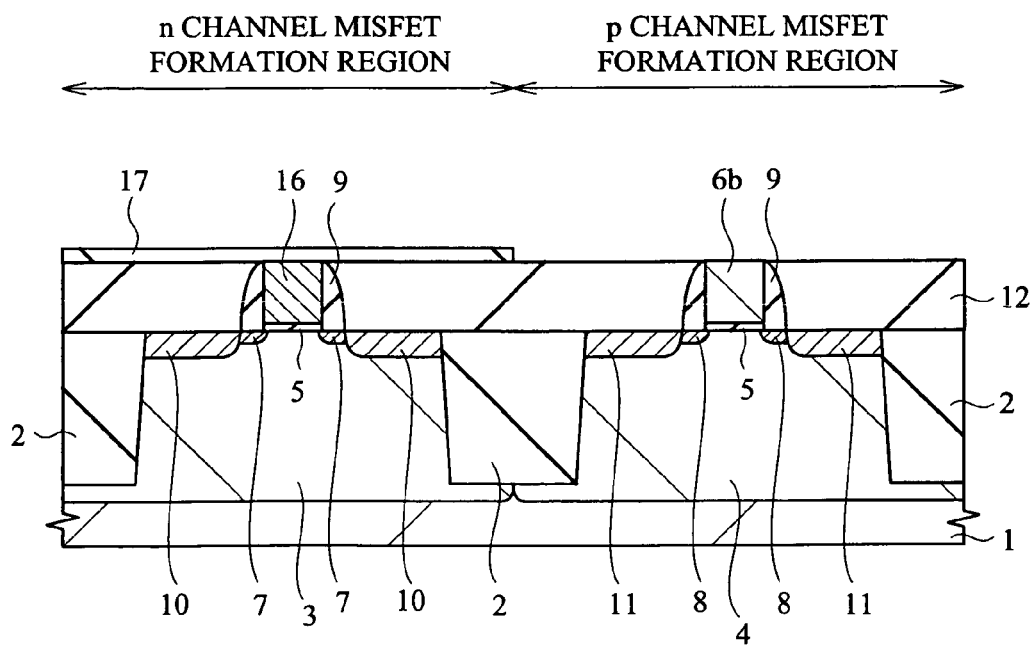
FIG. 12 is a section view for describing the manufacturing process of a semiconductor device continued from FIG. 11.

Next, unreacted portions of the nickel film 15 and the adhesion film 14 are sequentially removed by using, for example, a chemical solution such as diluted hydrofluoric acid or by using CMP, and then, an insulating film (third insulating film) 17 is formed on the silicon oxide film 12. Thereafter, as shown in FIG. 12, the insulating film 17 is patterned through photolithography and etching process. This patterning is performed so that the insulating film 17 is left only in the n channel MISFET formation region.

Figure 13:
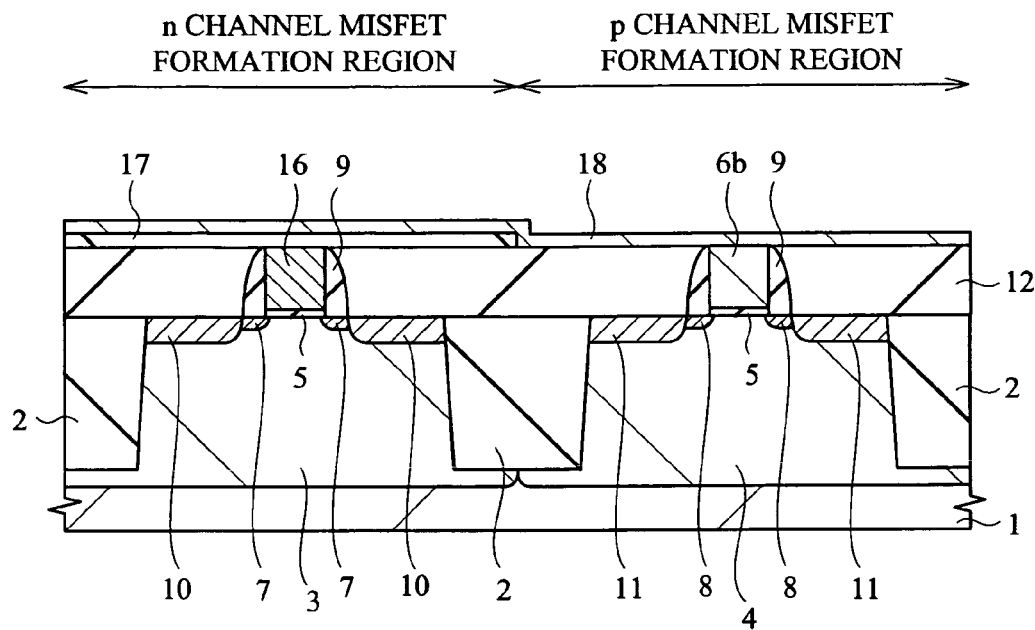
FIG. 13 is a section view for describing the manufacturing process of a semiconductor device continued from FIG. 12.

Then, as shown in FIG. 13, an adhesion film (first adhesion film) 18 is formed on the patterned insulating film 17 and the silicon oxide film 12. This adhesion film 18 is formed of a titanium film, a hafnium film, a zirconium film, or a tantalum film, and has a film thickness of, for example, 5 nm or less. For example, the adhesion film 18 can be formed by using spattering.

Figure 14:
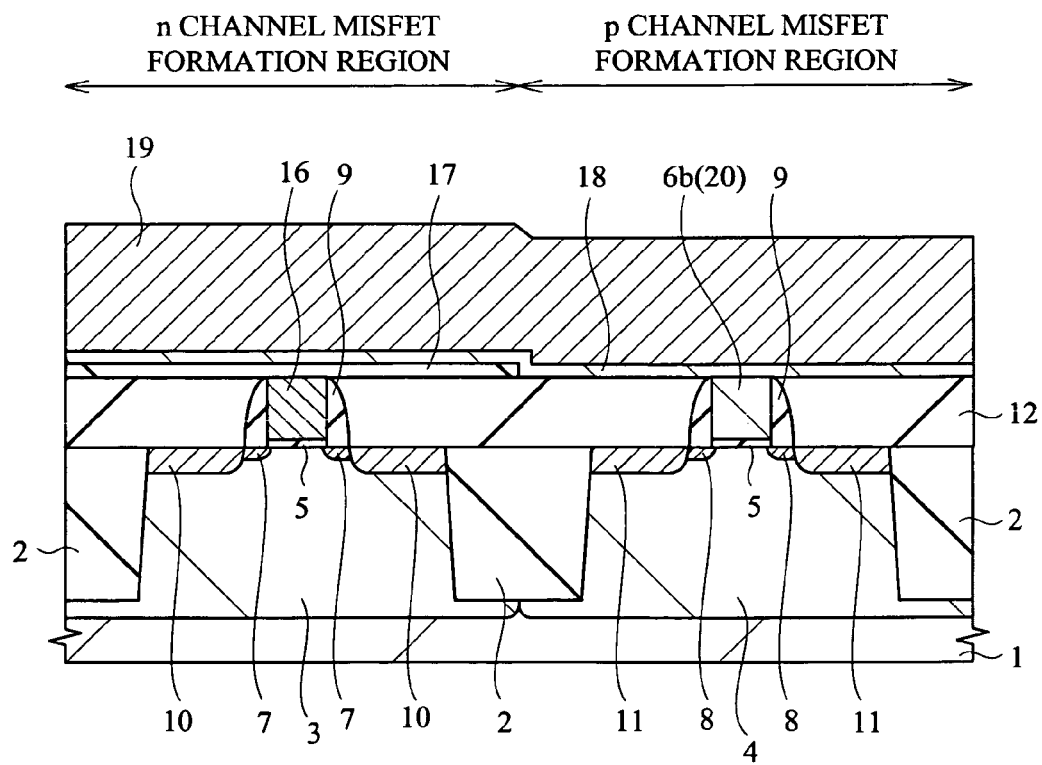
FIG. 14 is a section view for describing the manufacturing process of a semiconductor device continued from FIG. 13.

Next, as shown in FIG. 14, a nickel film (second metal film) 19 is formed on the adhesion film 18. For example, the nickel film 19 can be formed by using spattering and has a film thickness of 80 nm or more. A range of this film thickness is set equal to or larger than three times the minimum metal film thickness with which a composition ratio of silicon atoms to metal atoms becomes 1 (the minimum metal film thickness of Ni for a silicon gate electrode of 50 nm is 28 nm).

Then, a thermal treatment of about 400° C. is performed to the semiconductor substrate 1. By this means, a silicide reaction proceeds between the silicon gate electrode 6b and the nickel film 19 having the adhesion film 18 therebetween, thereby forming a gate electrode 20 composed of a nickel-rich silicide film. Compared with the film thickness of the silicon gate electrode 6b (50 nm), the film thickness of the nickel film is sufficiently large (80 nm or more). Therefore, the nickel silicide film formed through the reaction between the silicon gate electrode 6b and the nickel film 19 has a composition ratio of silicon atoms to nickel atoms of smaller than 1 ($NiSi_x$: x<1). More specifically, the gate electrode 20 is formed of a partial silicide electrode with a composition ratio of silicon atoms to nickel atoms of smaller than 1. In other words, the gate electrode 20 in the p channel MISFET is formed of the partial silicide electrode. Meanwhile, since the insulating film 17 is formed in the n channel MISFET formation region, a silicide reaction does not proceed in this process. Therefore, the gate electrode 16 in the n channel MISFET still remains as the full silicide electrode.

In the first embodiment, the gate electrode 20 in the p channel MISFET is formed of a nickel-rich silicide film. This is because of the following reason. When a high dielectric film is used as the gate insulating film 5 and a polysilicon film is used as a gate electrode, an increase in threshold voltage occurs due to Fermi level pinning. This increase in threshold voltage is more significant in the p channel MISFET than the n channel MISFET. More specifically, due to Fermi level pinning, the work function of the gate electrode of the n channel MISFET and that of the p channel MISFET are both fixed to a position near a conduction band approximately from the center of an Si forbidden band. In the n channel MISFET, when the work function of the gate electrode is present in the vicinity of the conduction band, the threshold voltage can be reduced. However, even if the work function of the gate electrode is moved from the vicinity of the conduction band to the position described above due to Fermi level pinning, the amount of movement is not so large. Therefore, an increase in threshold voltage does not pose a large problem. Meanwhile, in the p channel MISFET, when the work function of the gate electrode is present in the vicinity of a valence band, the threshold voltage can be reduced. However, when the work function of the gate electrode is moved from the vicinity of the valence band to the position described above due to Fermi level pinning, the amount of movement is larger than that of the n channel MISFET. Therefore, in the p channel MISFET, an increase in threshold voltage is large, which poses a large problem.

To get around this, in the p channel MISFET, a nickel-rich silicide film is used as a gate electrode of the p channel MISFET because Fermi level pinning can be mitigated by reducing the amount of silicon contained in the gate electrode. More specifically, since the work function of the nickel-rich silicide film is suitable for reducing the threshold voltage of the p channel MISFET, the nickel-rich silicide film is used as a gate electrode of the p channel MISFET. The nickel-rich silicide film indicates a film with a composition ratio of silicon atoms to nickel atoms of smaller than 1. Specifically, the nickel-rich silicide film has a composition of, for example, $Ni_3Si$.

As described above, since the gate electrode 20 of the p channel MISFET is formed of a nickel-rich silicide film, the film thickness of the nickel film 19 shown in FIG. 14 (80 nm or more) is larger than the film thickness of the nickel film 15 (35 nm) for use in forming the gate electrode 16 of the n channel MISFET. That is, the nickel-rich silicide film can be formed by forming the nickel film 19 having a film thickness sufficiently larger than that of the silicon gate electrode 6b.

In this case, since the film thickness of the nickel film 19 is sufficiently large, the nickel film 19 tends to come off in the thermal treatment at the time of silicide reaction or the CMP process for removing an unreacted portion of the nickel film 19. That is, compared with the nickel film 15 with the thickness of 35 nm shown in FIG. 11, the nickel film 19 with the thickness of 80 nm or larger tends to come off due to its large film thickness. However, in the first embodiment, the nickel film 19 is not directly formed on the silicon oxide film 12 and the insulating film 17 but is formed via the adhesion film 18. Therefore, the coming-off of the film can be prevented even in the case of the nickel film 19 having a large film thickness. In the case of the nickel film 19 having a large film thickness, a large foreign matter will be produced if the coming-off of the film occurs. However, since the adhesion film 18 is formed, the occurrence of such a foreign matter can be prevented. In this manner, in the first embodiment, the adhesion film 14 or the adhesion film 18 is used in both of the process of forming the gate electrode 16 of the n channel MISFET and the process of forming the gate electrode 20 of the p channel MISFET. In particular, such an adhesion film is effective in forming the gate electrode 20 using the nickel film 19 that has a large film thickness and therefore tends to come off. More specifically, since the nickel film 15 having a small film thickness is used when forming the gate electrode 16 of the n channel MISFET, the coming-off of the film may not be a large problem. Therefore, when forming the gate electrode (full silicide electrode) 16 of the n channel MISFET, it is preferable to provide the adhesion film 14 but it is not always imperative. Meanwhile, when forming the gate electrode (partial silicide electrode) 20 of the p channel MISFET, the adhesion film 18 is imperative. As a result, the occurrence of foreign matters due to the coming-off of the nickel film 19 can be prevented, and the yield in the manufacturing process can be improved and management cost of the manufacturing apparatus can be reduced.

Note that, although the nickel film 19 is used to form the gate electrode 20 of the p channel MISFET, a platinum film, a ruthenium film, or an iridium film, for example, may be used in place of the nickel film. Also in this case, since the adhesion property with the adhesion film 18 is excellent, the occurrence of foreign matters due to the coming-off of the film can be suppressed.

Figure 15:
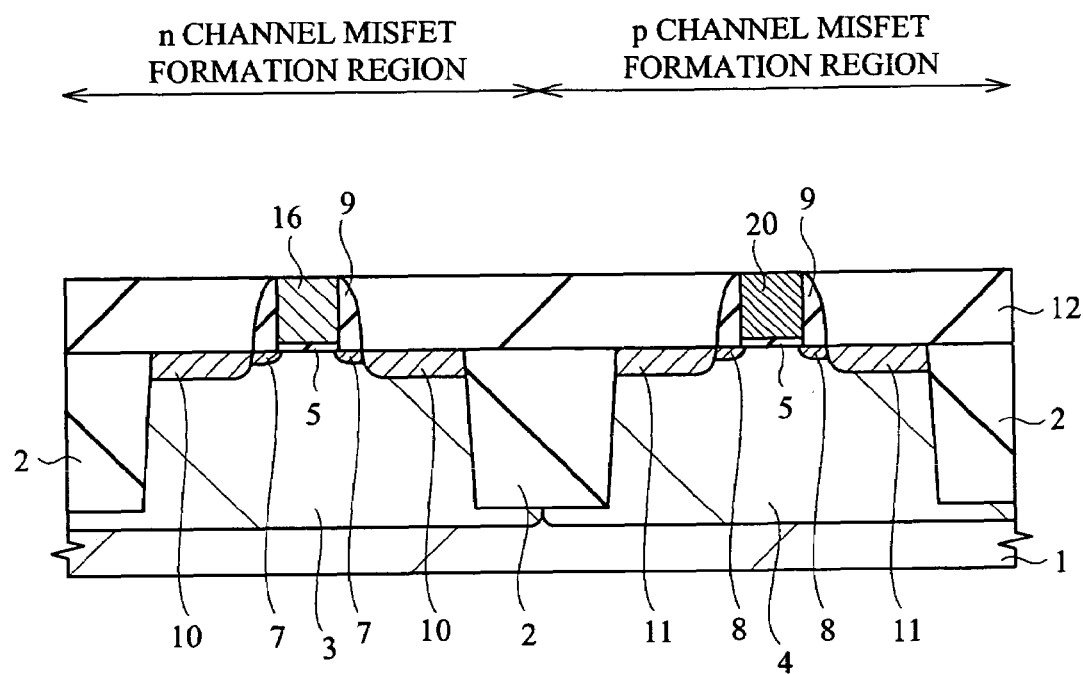
FIG. 15 is a section view for describing the manufacturing process of a semiconductor device continued from FIG. 14.

Next, as shown in FIG. 15, unreacted portions of the nickel film 19 and the adhesion film 18 are sequentially removed by using a chemical solution such as diluted hydrofluoric acid or CMP, for example.

Figure 16:
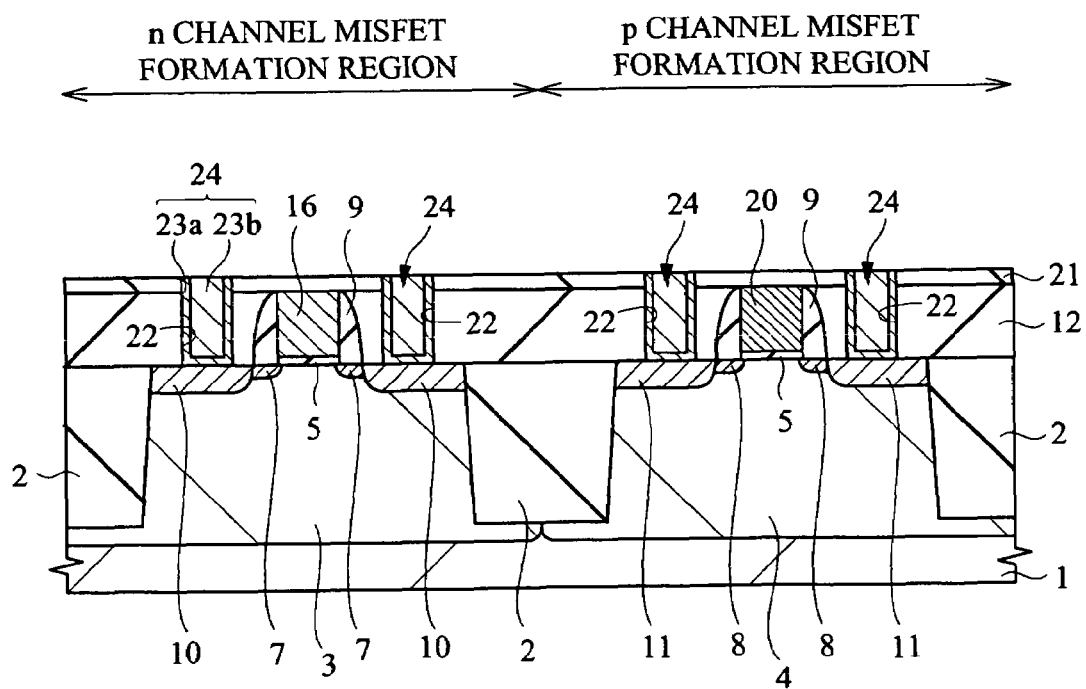
FIG. 16 is a section view for describing the manufacturing process of a semiconductor device continued from FIG. 15.

Subsequently, as shown in FIG. 16, for example, a silicon oxide film 21 is formed by using CVD on the silicon oxide film 12. Then, contact holes 22 are formed in the silicon oxide film 12 and the silicon oxide film 21 through photolithography and etching process. Thereafter, a titanium/titanium nitride film 23a is formed by using spattering on the silicon oxide film 21 including the inside of the contact holes 22. Next, a tungsten film 23b is formed on the titanium/titanium nitride film 23a by using CVD, for example. By doing so, the inside of the contact holes 22 is filled with the titanium/titanium nitride film 23a and the tungsten film 23b. Then, unnecessary portions of the titanium/titanium nitride film 23a and the tungsten film 23b formed on the silicon oxide film 21 are removed through CMP. In this manner, the titanium/titanium nitride film 23a and the tungsten film 23b are left only inside the contact holes 22, thereby forming plugs 24.

Figure 17:
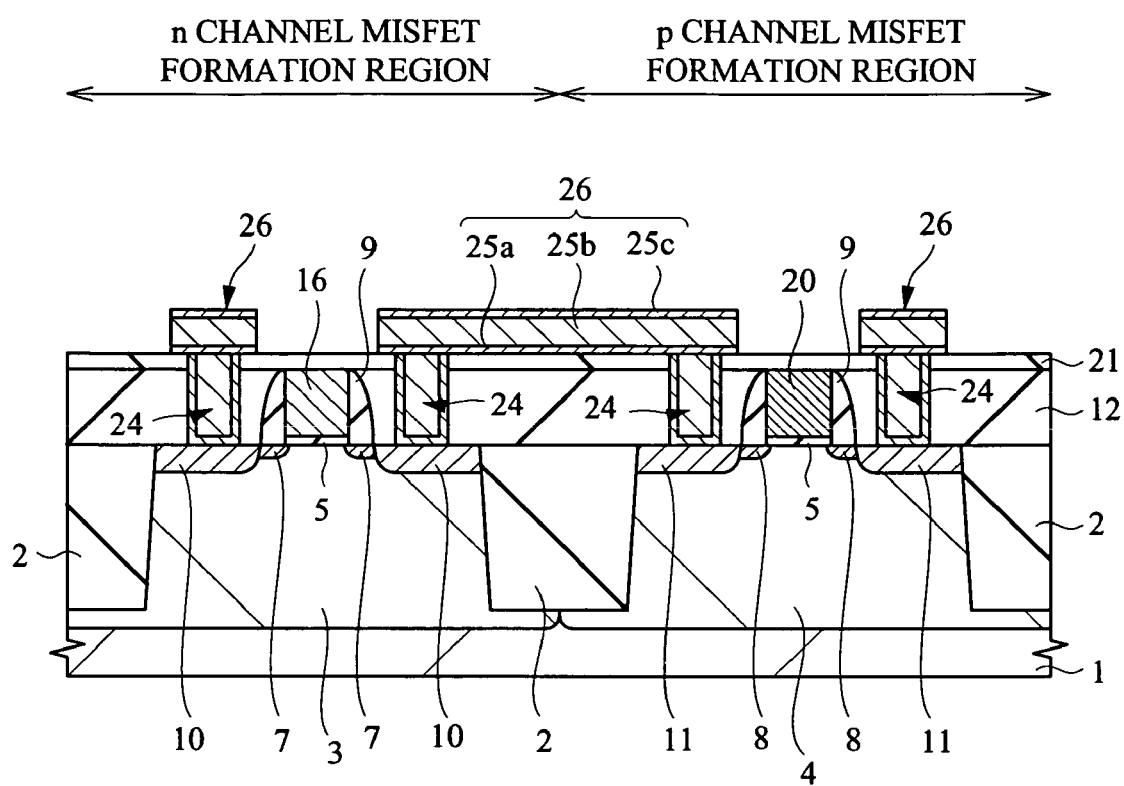
FIG. 17 is a section view for describing the manufacturing process of a semiconductor device continued from FIG. 16.

Next, as shown in FIG. 17, a multilayered film of a titanium/titanium nitride film 25a, an aluminum film 25b, and a titanium/titanium nitride film 25c is formed on the silicon oxide film 21. Then, the multilayered film is patterned through photolithography and etching process, thereby forming wires 26. In this manner, a semiconductor device according to the first embodiment can be manufactured.

When an adhesion film composed of, for example, a titanium film is formed between the silicon gate electrode and the nickel film, the problem is whether the adhesion film might hinder the silicide reaction between the silicon gate electrode and the nickel film. More specifically, when no adhesion film is provided, the silicon gate electrode and the nickel film are directly in contact with each other. Therefore, a silicide reaction proceeds by heating the semiconductor substrate. On the other hand, when an adhesion film is provided, the adhesion film is interposed between the silicon gate electrode and the nickel film. Therefore, the problem is whether a silicide reaction between the silicon gate electrode and the nickel film proceeds when the semiconductor substrate is heated.

In such a circumstance, an experiment has been performed so as to experimentally confirm that the silicide reaction between a silicon gate electrode and a nickel film is not affected even when an adhesion film is provided between the silicon gate electrode and the nickel film. The results of the experiment will be described below.

Figure 18:
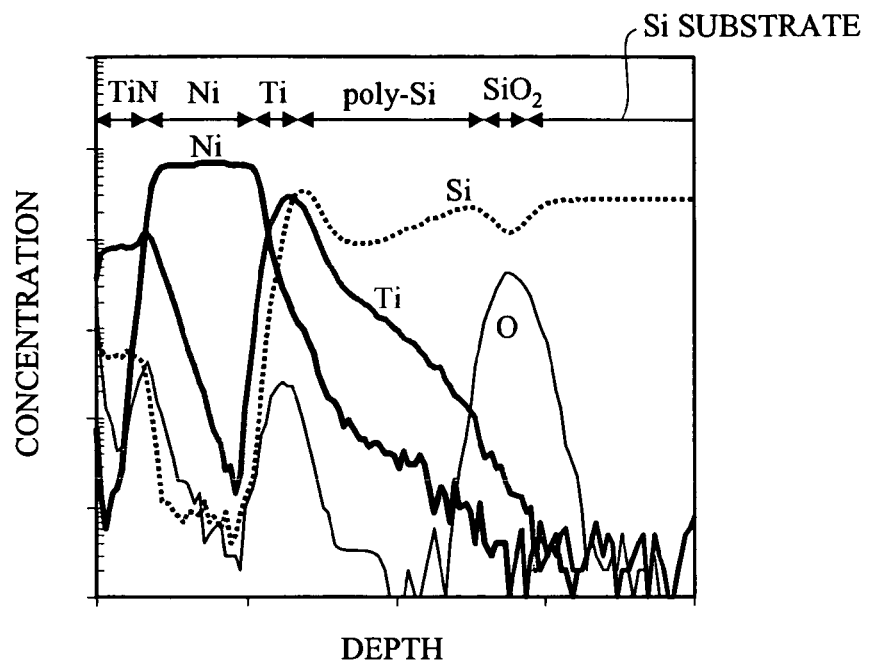
FIG. 18 is a graph showing a relation between a depth and concentration of elements introduced to the depth before silicide reaction.

FIG. 18 depicts a relation between a depth in a direction perpendicular to the semiconductor substrate and concentration of elements introduced to this depth. The horizontal axis represents the depth in a direction perpendicular to the semiconductor substrate. In this horizontal axis, a gate insulating film is formed on the semiconductor substrate, and a silicon gate electrode is formed on this gate insulating film. On the silicon gate electrode, a titanium film to be an adhesion film is formed, and a nickel film and a titanium nitride film are formed on this titanium film. The horizontal axis of FIG. 18 sequentially represents a structure from the titanium nitride film formed as the uppermost layer to its underlying films. Note that FIG. 18 depicts a state before a silicide reaction is caused to occur. In the experiment, for example, it is assumed that the silicon gate electrode has a film thickness of 50 nm and the titanium film formed on the silicon gate electrode has a film thickness of 5 nm. Also, the nickel film formed on the titanium film has a film thickness of 35 nm.

As shown in FIG. 18, since the titanium nitride film is formed as the uppermost layer, the concentration of titanium is high. Also, as the depth goes deeper, the concentration of titanium is decreased and the concentration of nickel is increased. This is because the nickel film is formed below the titanium nitride film. The reason why the titanium nitride film is formed on the nickel film is to prevent the surface of the nickel film from being oxidized. Subsequently, the titanium film, which is an adhesion film, is formed below the nickel film. That is the reason why the concentration of titanium is high. Further, since the silicon gate electrode is formed below the titanium film, the concentration of titanium is decreased, and the concentration of silicon is increased. Furthermore, since the gate insulating film composed of a silicon oxide film is formed below the silicon gate electrode, the concentration of silicon and that of oxygen are high. Also, since the semiconductor substrate made of silicon is formed below the gate insulating film, the concentration of silicon is high. Note that, in this experiment, although the silicon oxide film is used as a gate insulating film in place of a high dielectric film, this does not have any influence on silicide reaction. Thus, the experiment results can also be applied to the case where the gate insulating film is a high dielectric film.

Figure 19:
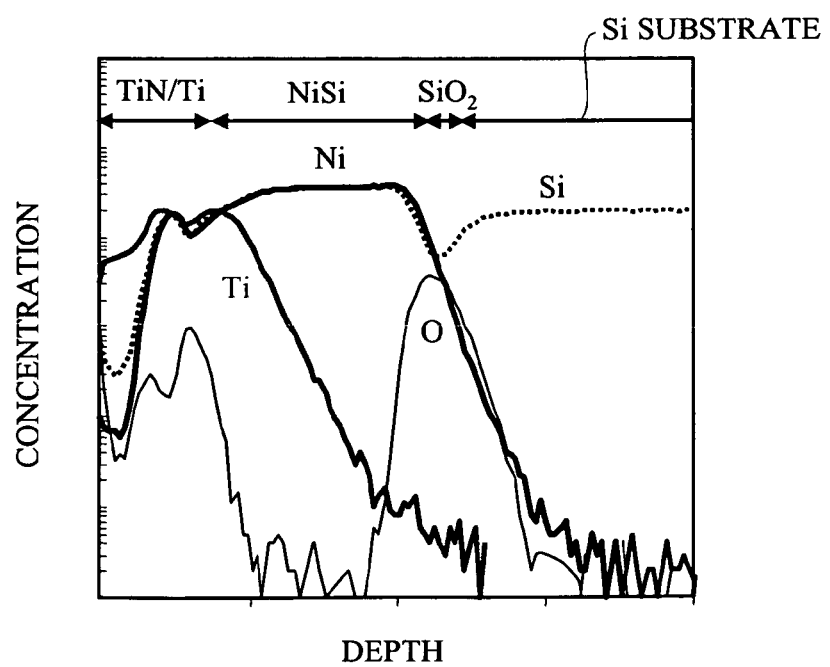
FIG. 19 is a graph showing a relation between a depth and concentration of elements introduced to the depth after silicide reaction.

In the state shown in FIG. 18, the semiconductor substrate is heated at approximately 400° C. FIG. 19 is a graph showing a relation between the depth and the concentration after heating the semiconductor substrate. As is apparent from FIG. 19, the concentration profile of the titanium film which is an adhesion film is not much changed, and nickel atoms are reacted with silicon atoms forming the silicon gate electrode to form a gate electrode composed of a nickel silicide film. That is, it is confirmed that the nickel atoms forming the nickel film pass through the titanium film to cause a silicide reaction with a polysilicon film forming the silicon gate electrode.

Figure 20:
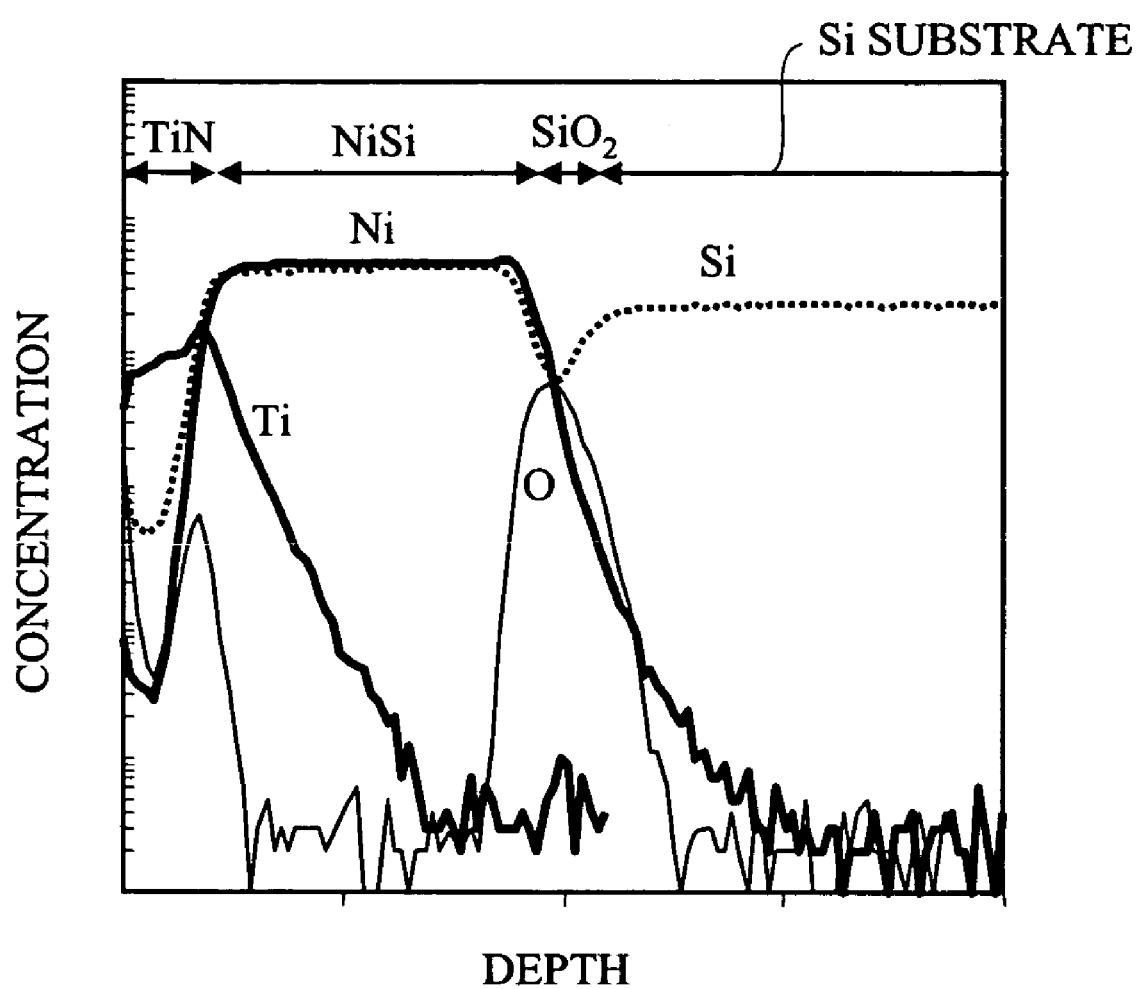
FIG. 20 is a graph showing a relation between a depth and concentration of elements introduced to the depth after silicide reaction in the case of not using an adhesion film.

For comparison, a relation between the depth and the concentration in the state where the semiconductor substrate is heated without using an adhesion film is depicted in FIG. 20. FIG. 20 depicts a state where a gate electrode composed of a nickel silicide film is formed without a titanium film which is an adhesion film. From the comparison between FIG. 19 and FIG. 20, it can be understood that the concentration profile of the nickel silicide film is approximately the same. From this result, it can be confirmed that, similar to the case of not providing an adhesion film, a silicide reaction proceeds even when an adhesion film is provided between the silicon gate electrode and the nickel film. Furthermore, when a flat-band voltage in the case of providing an adhesion film and a flat-band voltage in the case of not providing an adhesion film are compared, it is confirmed that there is no change. More specifically, it can be found that, even when an adhesion film is provided, electric characteristics similar to those in the case of not providing an adhesion film can be obtained.

From the above, it can be understood that a silicide reaction between the nickel film and the silicon gate electrode is not affected even when an adhesion film is provided.

Second Embodiment

In the first embodiment described above, an exemplary case where the adhesion between the insulating film and the nickel film is increased by providing an adhesion film between the insulating film and the nickel film has been described. In a second embodiment, an exemplary case where a nickel film is formed in the state where the semiconductor substrate is being heated so as to increase the adhesion between the insulating film and the nickel film will be described.

In the second embodiment, a process of forming a gate electrode of the p channel MISFET will be exemplarily described. This gate electrode is a partial silicide electrode formed of a nickel-rich silicide film.

The manufacturing process of a semiconductor device in the second embodiment is approximately similar to the manufacturing process of a semiconductor device in the first embodiment. Therefore, only the different points are mainly described herein. As shown in FIG. 12, the insulating film 17 is patterned through photolithography and etching process. The pattering is performed so that the insulating film 17 is left only in the n channel MISFET formation region.

Figure 21:
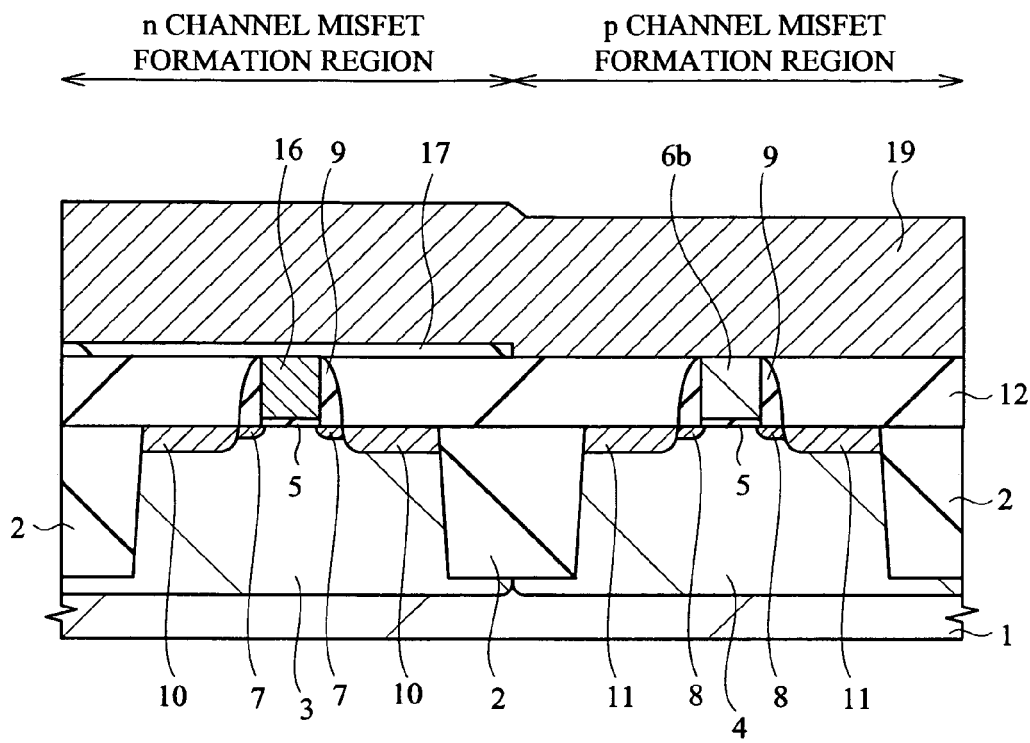
FIG. 21 is a section view for describing a manufacturing process of a semiconductor device in a second embodiment of the present invention.

Then, as shown in FIG. 21, the nickel film 19 is formed on the silicon oxide film 12 and the insulating film 17. At this time, the nickel film 19 is formed in the state where the semiconductor substrate 1 is being heated. Therefore, the nickel film 19 is also formed at a high temperature.

One of the causes of the coming off of the nickel film 19 from the insulating films (the silicon oxide film 12 and the insulating film 17) is ascribable to internal stress of the nickel film 19. It is considered that this internal stress depends on a film-formation temperature and it is decreased when the film-formation temperature is increased to some degree. Therefore, by increasing the heating temperature of the semiconductor substrate 1 when the nickel film 19 is formed, the stress inside the nickel film 19 can be reduced. If the internal stress of the nickel film 19 can be reduced, the nickel film 19 can be prevented from coming off from the insulating films (the silicon oxide film 12 and the insulating film 17). Therefore, the adhesion property can be improved.

The nickel film 19 can be formed by using, for example, spattering. The semiconductor substrate 1 is preferably heated at 100° C. to 500° C. Note that, in the second embodiment, the case of forming the gate electrode (partial silicide electrode) of the p channel MISFET has been described. However, as a matter of course, the second embodiment can be applied also to the case of forming the gate electrode (full silicide electrode) of the n channel MISFET.

Thereafter, in a manner similar to that of the first embodiment, the semiconductor substrate 1 is heated to cause a silicide reaction between the silicon gate electrode 6b and the nickel film. By doing so, the gate electrode 20 composed of a nickel-rich silicide film can be formed. Then, an unreacted portion of the nickel film 19 is removed by a chemical solution or CMP.

Also in the second embodiment, the adhesion property between the nickel film 19 and the insulating films (the silicon oxide film 12 and the insulating film 17) can be increased. Therefore, similar to the first embodiment, the occurrence of foreign matters due to the coming-off of the nickel film 19 can be prevented. Accordingly, it is possible to increase the yield in manufacturing process and reduce the management cost of the manufacturing apparatus.

In the second embodiment, the example of using a nickel film has been described. This is not meant to be restrictive. The second embodiment can be applied also to the case of using a platinum film, a ruthenium film, an iridium film, or the like.

Third Embodiment

In the second embodiment, an exemplary case where the nickel film is formed in the state where the semiconductor substrate is being heated has been described. In a third embodiment, an exemplary case where the nickel film is formed after the surface of the insulating film is roughened will be described.

In the third embodiment, a process of forming a gate electrode of the p channel MISFET will be exemplarily described. The manufacturing process of a semiconductor device in the third embodiment is approximately similar to the manufacturing process of a semiconductor device in the first embodiment. Therefore, only the different points are mainly described herein. As shown in FIG. 12, the insulating film 17 is patterned through photolithography and etching process. The pattering is performed so that the insulating film 17 is left only in the n channel MISFET formation region.

Figure 22:
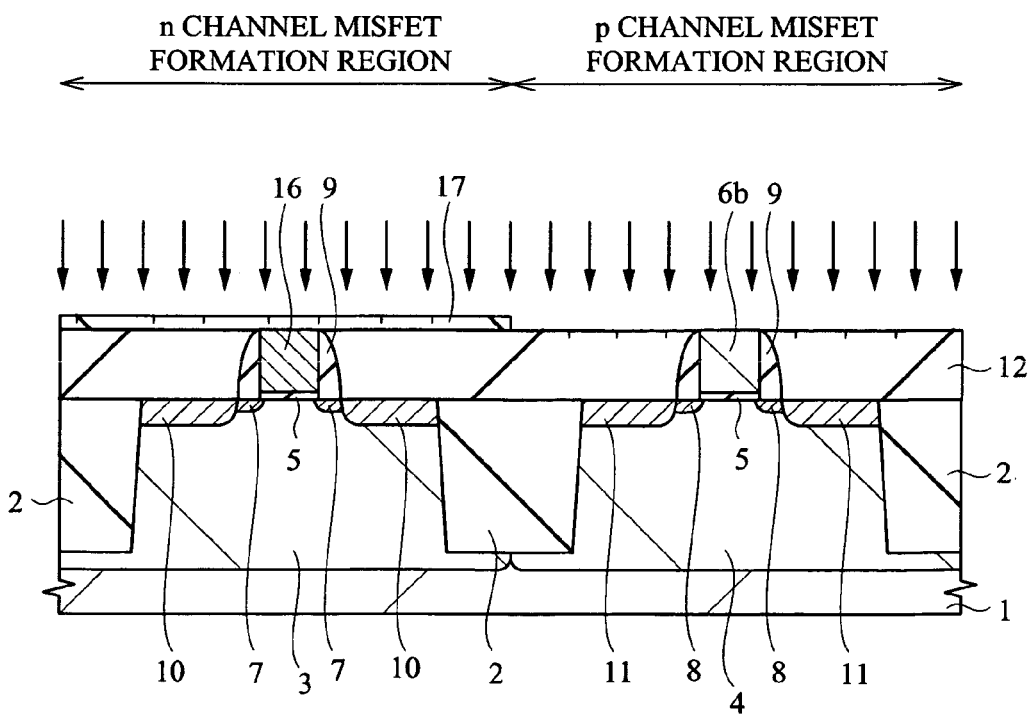

Subsequently, as shown in FIG. 22, the surface of the silicon oxide film 12 and the insulating film 17 is roughened. The ion collision can be used to roughen the surface of the insulating films (the silicon oxide film 12 and the insulating film 17). For example, in spattering apparatus, a semiconductor substrate is placed not at a film-forming position but at a target placing position. Then, argon ions are accelerated by an electric field and are allowed to collide with the semiconductor substrate 1 placed at the target position. By doing so, the surface of the silicon oxide film 12 and the insulating film 17 formed on the semiconductor substrate 1 are shaved by the collision of argon ions. In this manner, the surface of the silicon oxide film 12 and the insulating film 17 can be roughened. Note that, although ion collision is used for the roughening process in the third embodiment, this is not meant to be restrictive. The surface of the silicon oxide film 12 and the insulating film 17 may be roughened by using another scheme.

Figure 23:
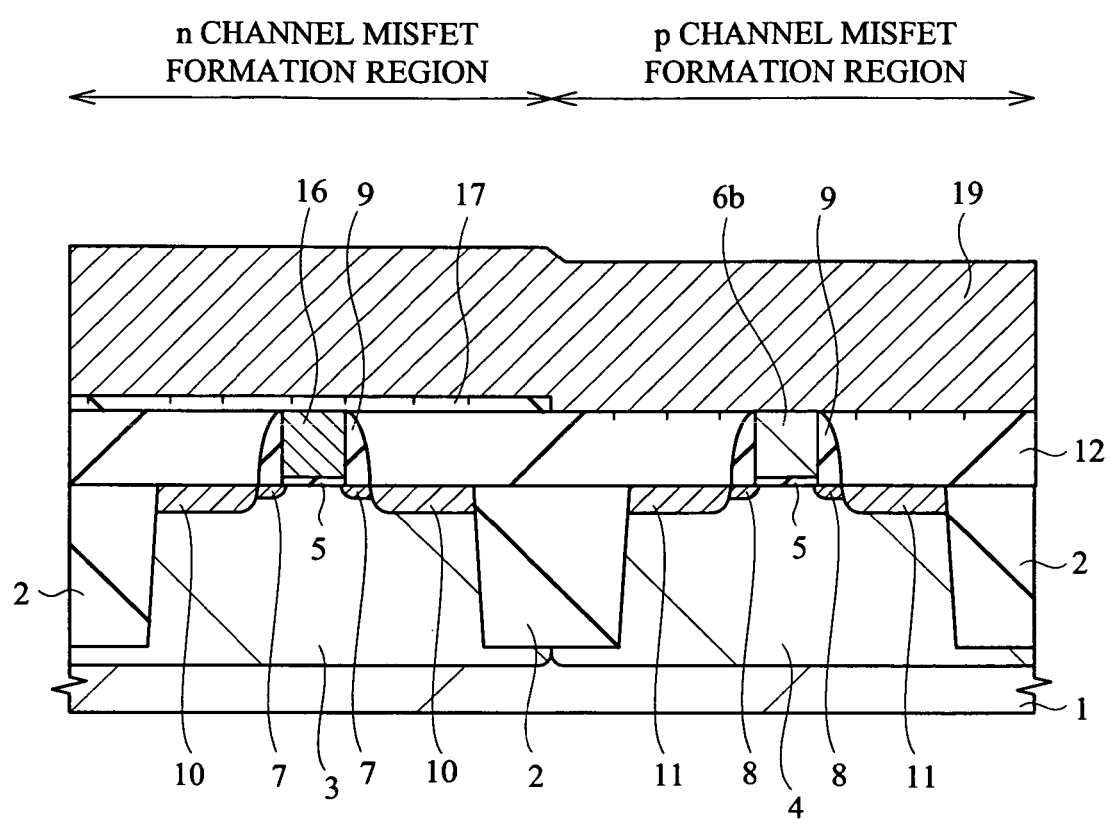
FIG. 23 is a section view for describing the manufacturing process of a semiconductor device continued from FIG. 22.

Next, as shown in FIG. 23, the nickel film 19 is formed on the roughened surface of the silicon oxide film 12 and the insulating film 17. The nickel film 19 can be formed by using spattering, for example. At this time, since the surface of the silicon oxide film 12 and the insulating film 17 is roughened, the adhesive of the nickel film 19 is increased by an anchor effect.

Thereafter, in a manner similar to that of the first embodiment, the semiconductor substrate 1 is heated to cause a silicide reaction between the silicon gate electrode 6b and the nickel film. By doing so, the gate electrode 20 composed of a nickel-rich silicide film can be formed. Then, an unreacted portion of the nickel film 19 is removed by a chemical solution or CMP.

As described above, according to the third embodiment, the adhesion property between the nickel film 19 and the insulating films (the silicon oxide film 12 and the insulating film 17) can be increased. Therefore, similar to the first embodiment, the occurrence of foreign matters due to the coming-off of the nickel film 19 can be prevented. Accordingly, it is possible to increase the yield in manufacturing process and reduce the management cost of the manufacturing apparatus.

Also, the roughening process and the formation of the nickel film 19 can be performed as a successive process by using the same spattering apparatus. Therefore, oxidization of the surface of the silicon gate electrode 6b exposed from the silicon oxide film 12 can be prevented. More specifically, the roughening process and the formation of the nickel film 19 can be performed as a successive process without carrying the semiconductor device outside the spattering apparatus. Therefore, the semiconductor substrate 1 is prevented from being exposed to external air. Therefore, since the surface of the silicon gate electrode is prevented from being oxidized even when the roughening process is added, it is possible to increase the reliability of the semiconductor device.

Note that, in the third embodiment, the example of using a nickel film has been described. However, this is not meant to be restrictive. The present embodiment can be applied to, for example, the case of using a platinum film, a nickel film, a ruthenium film, an iridium film, or the like. Also, in the third embodiment, the case of forming the gate electrode (partial silicide electrode) of the p channel MISFET has been described. However, as a matter of course, the present embodiment can be applied also to the case of forming the gate electrode (full silicide electrode) of the n channel MISFET.

In the foregoing, the invention made by the inventors of the present invention has been concretely described based on the embodiments. However, it is needless to say that the present invention is not limited to the foregoing embodiments and various modifications and alterations can be made within the scope of the present invention.

Although CMISFETs have been described in the above embodiments, the present invention can be applied also to the case of manufacturing only n channel MISFETs and p channel MISFETs.

The present invention can be widely used in the manufacturing industries for manufacturing semiconductor devices.

What is claimed is:

1. A manufacturing method of a semiconductor device in which an n channel MISFET is formed in a first region on a semiconductor substrate and a p channel MISFET is formed in a second region on said semiconductor substrate, said method comprising the steps of:
(a) forming a gate insulating film with a dielectric constant higher than that of a silicon oxide film over said semiconductor substrate; (b) forming a first silicon gate electrode for said n channel MISFET over said gate insulating film in said first region and a second silicon gate electrode for said p channel MISFET over said gate insulating film in said second region;

(c) forming a first insulating film having a film thickness larger than that of said first silicon gate electrode and that of said second silicon gate electrode;

(d) exposing a surface of said first silicon gate electrode and a surface of said second silicon gate electrode by planarizing a surface of said first insulating film;

(e) selectively forming a second insulating film which covers said second silicon gate electrode;

(f) forming a first adhesion film on said first insulating film including said exposed first silicon gate electrode and on said second insulating film;

(g) forming a first metal film on said first adhesion film;

(h) forming a first gate electrode composed of a first metal silicide film by heating said semiconductor substrate such that first metal atoms forming said first metal film pass through said first adhesion film so as to cause a reaction with said first silicon gate electrode;

(i) sequentially removing an unreacted portion of said first metal film and said first adhesion film;

(j) sequentially removing said second insulating film formed over said second silicon gate electrode;

(k) selectively forming a third insulating film which covers said first gate electrode;

(l) forming a second adhesion film on said first insulating film including said exposed second silicon gate electrode and said third insulating film;

(m) forming a second metal film on said second adhesion film;

(n) forming a second gate electrode composed of a second metal suicide film by heating said semiconductor substrate such that second metal atoms forming said second metal film pass through said second adhesion film so as to cause a reaction with said second silicon gate electrode;

(o) sequentially removing an unreacted portion of said second metal film and said second adhesion film; and (p) sequentially removing said third insulating film formed over said first silicon gate electrode, wherein adhesion of said first adhesion film to said first insulating film and said first adhesion film to said first metal film are higher than adhesion of said first metal film to said first insulating film, wherein adhesion of said second adhesion film to said first insulating film and said second adhesion film to said second metal film are higher than adhesion of said second metal film to said first insulating film, wherein said first adhesion film is thinner than the first metal film, wherein said second adhesion film is thinner than the second metal film, wherein the first metal and the second metal consist of the same metal, wherein a composition ratio of silicon atoms to metal atoms is 1 in said first metal silicide film, and wherein an amount ratio of silicon atoms to metal atoms in said second metal silicide film is smaller than an amount ratio of silicon atoms to metal atoms in said first metal silicide, and is smaller than 1.

2. The manufacturing method of a semiconductor device according to claim 1, wherein said second metal film has a thickness larger than that of said first metal film.

3. The manufacturing method of a semiconductor device according to claim 1, wherein said second metal film has a thickness equal to or higher than three times a minimum metal thickness with which a composition ratio of silicon atoms to metal atoms becomes 1 in said second metal film.

4. The manufacturing method of a semiconductor device according to claim 1, wherein said first and second adhesion films are formed of a film mainly containing a titanium film, a hafnium film, a zirconium film, or a tantalum film, respectively.

5. The manufacturing method of a semiconductor device according to claim 1, wherein said first and second adhesion films have a film thickness of 5 nm or less, respectively.

6. The manufacturing method of a semiconductor device according to claim 1, wherein said first insulating film is formed of a film mainly containing a silicon oxide film.

7. The manufacturing method of a semiconductor device according to claim 1, wherein said gate insulating film is formed of a film mainly containing any one of Hf—O, Hf—O—N Hf—Si—O, Hf Si—O—N, Hf—Al—O, $La_2O_3$, La—O—N, La—Si—O, La—Si—O—N, $Y_2O_3$, Y—O—N, Y—Si—O, Y—Si—O—N, $Gd_2Q_3$, Gd—O—N Gd—Si—O, and Gd—Si—O—N.

8. The manufacturing method of a semiconductor device according to claim 1, wherein said first and second metal films are formed of any one of a platinum film, a nickel film, a ruthenium film, and an iridium film, respectively.

9. The manufacturing method of a semiconductor device according to claim 1, wherein a thickness of said first adhesion film is thicker than a thickness of said first metal film, and wherein a thickness of said second adhesion film is thicker than a thickness of said second metal film.

10. The manufacturing method of a semiconductor device according to claim 1, wherein adhesion of said first adhesion film to said first metal film is higher than adhesion of said first metal film to said second insulating film, and wherein adhesion of said second adhesion film to said second metal film is higher than adhesion of said second metal film to said third insulating film.

* * * * *